(12) United States Patent
Buda et al.

(10) Patent No.: US 7,251,381 B2
(45) Date of Patent: Jul. 31, 2007

(54) SINGLE-MODE OPTICAL DEVICE

(75) Inventors: Manuela Buda, Canberra (AU); Hark Hoe Tan, Grarran (AU); Lan Fu, Palmerston (AU); Lalita Josyula, New Delhi (IN); Michael Francis Aggett, Melba (AU); Chennupati Jagadish, Evatt (AU)

(73) Assignee: The Australian National University, Australian Capital Territory (AU)

( * ) Notice: Subject to any disclaimer, the term of this patent is extended or adjusted under 35 U.S.C. 154(b) by 0 days.

(21) Appl. No.: 10/406,808

(22) Filed: Apr. 3, 2003

(65) Prior Publication Data

US 2004/0017836 A1 Jan. 29, 2004

(30) Foreign Application Priority Data

Apr. 3, 2002 (AU) ........................... PS1507
Apr. 3, 2002 (AU) ........................... PS1508

(51) Int. Cl.
*G02B 6/00* (2006.01)
(52) U.S. Cl. ........................ 385/11; 385/131; 372/45
(58) Field of Classification Search ................. 385/11, 385/131; 372/3, 45
See application file for complete search history.

(56) References Cited

U.S. PATENT DOCUMENTS

| 4,328,469 A | 5/1982 | Scifres et al. |
| 5,197,077 A | 3/1993 | Harding et al. |
| 5,260,959 A | 11/1993 | Hayakawa |
| 5,289,484 A | 2/1994 | Hayakawa |
| 5,309,465 A * | 5/1994 | Antreasyan et al. .......... 372/43 |
| 5,594,749 A | 1/1997 | Behfar-Rad et al. |
| 5,815,521 A | 9/1998 | Hobson et al. |

(Continued)

FOREIGN PATENT DOCUMENTS

EP 0 790 685 B1 7/2001

(Continued)

OTHER PUBLICATIONS

G. Iordache et al., High power CW output from low confinement asymmetric structure diode laser, *Electronics Letters*, vol. 35, No. 2, Jan. 21, 1999, pp. 148-149.

(Continued)

*Primary Examiner*—Ellen E. Kim
(74) *Attorney, Agent, or Firm*—Knobbe, Martens, Olson & Bear, LLP

(57) ABSTRACT

A single-mode optical device, including a first region, and a second region laterally disposed about the first region, and including an absorbing layer and an isolation layer between the absorbing layer and the first region, wherein the thickness of the isolation layer is selected to control optical loss from the first region to the absorbing layer in the second region and thereby to attenuate one or more high order lateral optical modes of the device. The one or more high order lateral optical modes are attenuated relative to the fundamental lateral mode to provide the device with a high kink power. The device can be a 980 nm ridge diode laser where the thickness of an oxide insulating layer around the ridge is selected to control optical losses into a gold contact layer and thereby attenuate the first order lateral mode, providing the laser with a kink power of at least about 250 mW.

29 Claims, 11 Drawing Sheets

U.S. PATENT DOCUMENTS

| | | | |
|---|---|---|---|
| 6,084,899 | A | 7/2000 | Shakuda |
| 6,167,072 | A | 12/2000 | Zory, Jr. |
| 6,285,694 | B1 | 9/2001 | Shigihara |
| 6,323,507 | B1* | 11/2001 | Yokoyama et al. ............ 257/79 |
| 6,650,671 | B1 | 11/2003 | Garbuzov et al. |
| 6,731,663 | B1* | 5/2004 | Kasukawa et al. ............ 372/45 |
| 2002/0117680 | A1* | 8/2002 | Yabusaki et al. ............ 257/101 |

FOREIGN PATENT DOCUMENTS

| | | |
|---|---|---|
| WO | WO 96/08062 | 3/1996 |

OTHER PUBLICATIONS

F. Gérard et al., Single Transverse-Mode Filtering Utilizing Ion Implantation: Application to 1.48-μm Unstable-Cavity Lasers, *IEEE Photonics Technology Letters*, vol. 12, No. 11, Nov. 2000, pp. 1447-1449.

Sylvie Delépine et al., How to Launch 1 W Into Single-Mode Fiber From a Single 1.48-μm Flared Resonator, *IEEE Journal Sel. Topics in Quantum Electronics*, vol. 7, No. 2, Mar./Apr. 2001, pp. 111-123.

S. Delepine et al., 0.7W in singlemode fibre from 1.48 μm semiconductor unstable-cavity laser with low-confinement asymmetric epilayer structure, *Electronics Letters*, vol. 36, No. 3, Feb. 3, 2000, pp. 221-223.

K.H. Park et al., Kink and beam steering free 0.98 μm high-power RWG lasers with partially ion implanted channels, *Electronics Letters*, vol. 34, No. 6, Mar. 19, 1998, pp. 562-563.

Malag, et al., MOVPE-grown (AlGa) As double-barrier multiquantum well (DBMQW) laser diode with low vertical beam divergence, *Journal of Crystal Growth*, vol. 170, 1997, pp. 408-412.

Sebastian, et al., High-Power 810-nm GaAsP-AlGaAs Diode Lasers With Narrow Beam Divergence, *IEEE Journal on Selected Topics in Quantum Electronics*, vol. 7, No. 2, Mar./Apr. 2001, pp. 334-339.

Temmyo, et al., *Design of high-power strained InGaAs/AlGaAs quantum-well lasers with a vertical divergence angle of 18°*, *Electronics Letters*, vol. 31, No. 8, Apr. 13, 1995, pp. 642-644.

V. Vusirkala et al., GaAs-AlGaAs QW Diluted Waveguide Laser with Low-Loss, Alignment-Tolerant Coupling to a Single-Mode Fiber, *IEEE Photonics Technology Letters*, vol. 8, No. 9, Sep. 1996, pp. 1130-1132.

Wu, et al., *Contact Reflectivity Effects on Thin p-Clad InGaAs Single Quantum-Well Lasers*, IEEE Photonics Technology Letters, vol. 6, No. 12, Dec. 1994, pp. 1427-1429.

Wu, et al., *Characterization of Thin p-Clad InGaAs Single-Quantum-Well Lasers*, IEEE Photonics Technology Letters, vol. 7, No. 7, Jul. 1995, pp. 718-720.

Smith, et al., *Metallization to asymmetric cladding separate confinement heterostructure lasers*, Appl. Phys. Lett. 67 (26), Dec., pp. 3847-3849.

U.S. Appl. No. 10/406,806, filed Apr. 3, 2003.

U.S. Appl. No. 10/406,804, filed Apr. 3, 2003.

* cited by examiner

SINGLE-MODE OPTICAL DEVICE

FIELD OF THE INVENTION

The present invention relates to a single-mode optical device. It has particular application to diode lasers and similar optical devices.

BACKGROUND

In a single-mode optical device with lateral confinement, it is generally important to favor the fundamental lateral optical mode over higher-order lateral modes. For example, a graph of the optical power produced by a diode laser as a function of its operating current is typically characterised by bends or 'kinks' joining essentially linear regions with different gradients. The kinks correspond to a phenomenon known as filamentation, whereby progressively higher order lateral modes of the laser cavity are excited with increasing current, accompanied by corresponding changes in the angle of maximum emission power. Such changes are undesirable because they degrade the coupling efficiency of a laser to an optical fiber. This limits the performance of single-mode diode lasers.

For example, high power, single emitter diode lasers operating at a wavelength of about 980 nm are used for pumping erbium-doped fiber amplifiers (EDFAs). Because the diameter of a single-mode EDFA is only a few microns, the coupling of output power from the laser to the EDFA is seriously compromised by angular shifts of as little as a few degrees. It is therefore desirable to operate such a high power pump laser in its fundamental transverse mode by ensuring that the kink power, i.e., the laser power at which filamentation first occurs, is as high as practically possible. The lifetime of a pump laser depends exponentially on its output power, and the closer a diode laser operates to the threshold power for instantaneous catastrophic optical damage (COD), the lower its lifetime. Commercial applications typically require lasers with operating lifetimes greater than about $10^5$ hours. There is thus a need for high yield production of reliable 980 nanometer diode lasers with kink-free output powers in excess of about 200 milliwatts (mW).

It is desired, therefore, to provide a single-mode optical device that alleviates one or more of the above difficulties, or at least a useful alternative to existing single-mode optical devices.

SUMMARY OF CERTAIN INVENTIVE ASPECTS

In accordance with one aspect of the present invention, there is provided a single-mode optical device, including a first region, and a second region laterally disposed about the first region, the second region including an absorbing layer and an isolation layer between the absorbing layer and the first region, wherein the thickness of the isolation layer is selected to control optical loss from the first region to the absorbing layer in the second region and thereby to attenuate one or more higher order lateral optical modes of the device relative to the fundamental lateral optical mode of the device.

Advantageously, the device may include a diode laser or an optical amplifier.

Preferably, the absorbing layer includes an electrically conducting layer and the isolation layer includes an electrically insulating layer.

Preferably, the electrically conducting layer provides electrical contact to the device.

Preferably, the electrically conducting layer comprises a gold layer.

Preferably, the electrically insulating layer includes one of a silicon oxide and a silicon nitride layer.

Preferably, the thickness is substantially less than about 200 nanometers (mn).

Preferably, the thickness is at most about 100 nm.

Preferably, the thickness is in the range about 50-100 nm.

Advantageously, the device may include a ridge diode laser, the first region may include an elongated ridge of the laser, and the second region may include a region around the ridge.

Preferably, the first order lateral optical mode is attenuated relative to the fundamental lateral mode of the device to provide the device with a high kink power.

Preferably, the first and one or more higher order lateral optical modes are attenuated relative to the fundamental lateral mode of the device to provide the device with a high kink power.

Various preferred embodiments of the present invention provide a new diode laser structure that achieves kink stabilization at higher power levels by using thinner oxide layers, in the range of about 50-100 nm, in order to controllably discriminate between the lateral fundamental mode and the first order mode. This has the consequence of increasing the yield of devices with kink powers exceeding the minimum kink power acceptable for a given application. The discrimination is achieved by controllably introducing additional losses outside the ridge region due to the extension of the optical field into the metal contact layer of the device. These losses strongly affect the first order mode and to a much lesser extent the fundamental mode. As a consequence, the kink occurs at higher power levels than for a device in general having, for example, an approximately 200 nm thick oxide layer.

Preferably, the device includes a plurality of layers having a substantially asymmetric refractive index profile with respect to a growth direction of the layers, producing an optical field distribution with a larger fraction of the distribution in n-type layers than in p-type layers of the laser.

Preferably, the layers include an active layer for generating the optical field, a trap layer for attracting the optical field, and a separation layer between the active layer and the trap layer for guiding the optical field into the trap layer.

Preferably, the kink power is at least about 200 mW.

More preferably, the kink power is at least about 250 mW.

Preferably, the width of the ridge is about 2-4 micrometers (μm).

Preferably, the length of the ridge is more than about 1.5 millimeters (mm).

Preferably, the length of the ridge is about 1.5-2 mm.

Certain embodiments of the present invention provide high kink power diode lasers with an oxide covered ridge for waveguiding in the lateral direction and an asymmetric low-confinement layer structure in the growth direction. The asymmetric structure reduces the optical field extension in p-type regions, reducing the optimum depth for etching the confinement region surrounding the ridge in comparison with typical symmetric structures. This makes it possible to use a wet etch for approximately 3-4 μm wide stripe devices without incurring a prohibitive increase of series resistance. The low confinement, asymmetric structure also provides a larger resistance to COD (improving reliability), reduced anti-guiding for improved lateral stability, and a moderate beam divergence due to the large spread of the optical field in n-type regions. Lasers produced in accordance with the invention are particularly suited for high power applications such as materials processing, medicine, and optical communications, such as 980 nm pump lasers for Er-doped fiber amplifiers.

BRIEF DESCRIPTION OF THE DRAWINGS

Preferred embodiments of the present invention are hereinafter described, by way of example only, with reference to the accompanying drawings, wherein.

DETAILED DESCRIPTION OF CERTAIN INVENTIVE EMBODIMENTS

Figure 1:
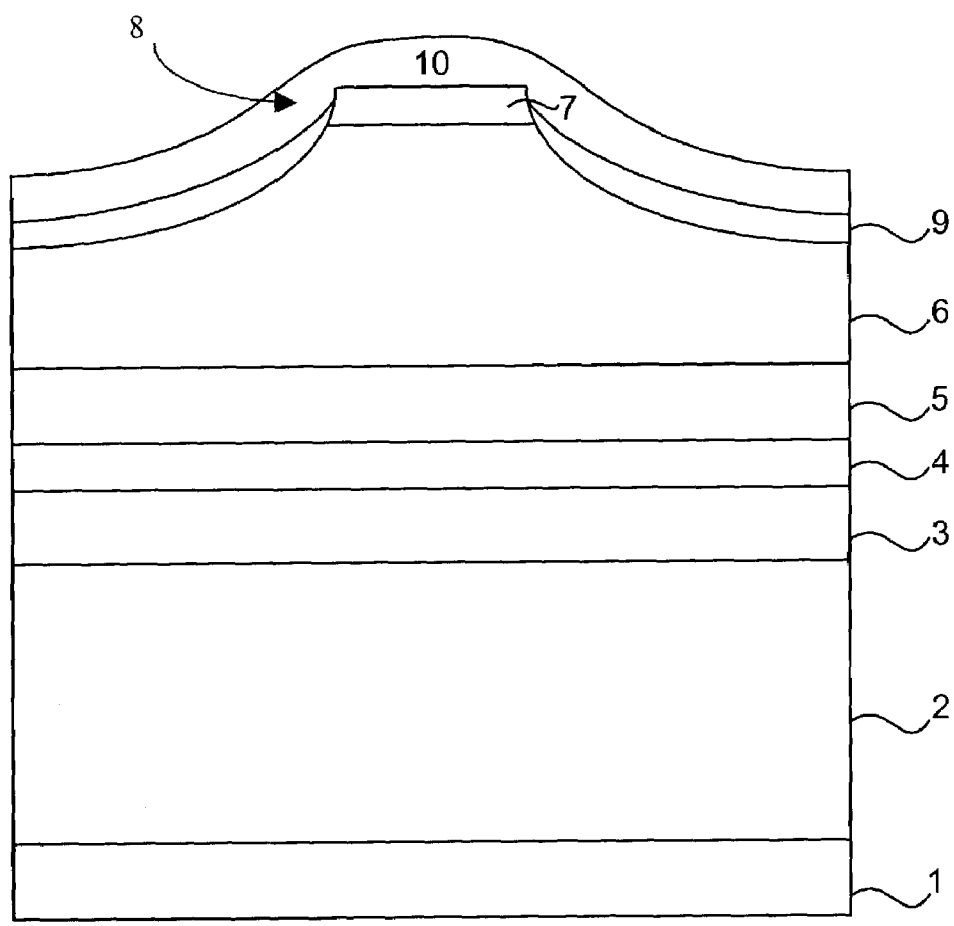
FIG. 1 is a schematic diagram of a preferred embodiment of a ridge diode laser.

A ridge diode laser, as shown in FIG. 1, includes an active layer 5, a waveguide layer 4, and an optical trap layer 3, located between a top p-type confinement or cladding layer 6, and a bottom n-type confinement layer 2. Electrical contact to the laser is facilitated by a $p^{++}$ GaAs contact layer 7 grown on the p-type cladding layer 6. A ridge structure 8 is fabricated by masked chemical etching of the entire contact layer 7 and most of the p-type confinement layer 6 to produce an elongated ridge 8 with a width of about 2-4 μm and a length (into the page in FIG. 1) of approximately 1-2 mm. After forming the ridge 8, an insulating $SiO_2$ layer 9 is deposited by plasma-enhanced chemical vapor deposition (PECVD) and a lift-off process is used to remove the oxide from the top of the ridge 8 to allow electrical contact. A metal contact layer 10 is then deposited by sequential electron-beam evaporation of Ti, Pt, and Au. The Ti provides good adhesion to the oxide 9, the Au ensures good electrical contact to the contact layer 7, and the Pt acts as a diffusion barrier between the Ti and the Au.

The layers 2 to 7 are grown on top of an $n^{++}$ GaAs substrate wafer 1 by a suitable epitaxial method such as metal-organic chemical vapor deposition (MOCVD), molecular beam epitaxy (MBE), or chemical beam epitaxy (CBE). Table 1 provides more detail of the diode laser structure, including the purpose, composition, thickness, conductivity type, and doping concentration of each layer, including spacer, barrier and graded index layers not shown in FIG. 1. With the exception of the $In_{0.2}Ga_{0.80}As$ quantum wells in the active layer 5, the compositions are indicated by the fractional content x of Al in the grown $Al_xGa_{1-x}As$ layers. In the described embodiment, the composition and thickness of the quantum wells in the active layer 5 were selected to generate photons with a wavelength of about 980 nm for optical pumping of erbium-doped fiber amplifiers for optical communications. However, it will be apparent that alternative compositions and thicknesses can be used to generate photons at other wavelengths for alternative applications.

TABLE 1

| layer number | layer purpose | composition index | thickness (μm) | conduct. type | doping conc. ($cm^{-3}$) |
|---|---|---|---|---|---|
| 7 | $p^{++}$ contact | 0.00 | 0.20 | $p^{++}$ | $>5 \times 10^{18}$ |
| 6 | p confinement | 0.60 | 1.00 | p | $5 \times 10^{17}$ |
| 5 | grading | 0.60→0.20 | 0.16 | — | undoped |
|   | spacer | 0.00 | 0.0018 | — | undoped |
|   | active | | 0.006 | — | undoped |
|   | $In_{0.20}Ga_{0.80}As$ | | | | |
|   | spacer | 0.00 | 0.0018 | — | undoped |
|   | barrier | 0.20 | 0.006 | — | undoped |
|   | spacer | 0.00 | 0.0018 | — | undoped |
|   | active | | 0.006 | — | undoped |
|   | $In_{0.20}Ga_{0.80}As$ | | | | |
|   | spacer | 0.00 | 0.0018 | — | undoped |
|   | grading | 0.20→0.60 | 0.16 | — | undoped |
| 4 | waveguide | 0.60 | 0.10 | n | $10^{17}$ |
|   | grading | 0.60→0.30 | 0.02 | n | $10^{17}$ |
| 3 | optical trap | 0.30 | 0.22 | n | $10^{17}$ |
|   | grading | 0.30→0.45 | 0.01 | n | $10^{17}$ |
| 2 | n confinement | 0.45 | 0.70 | n | $5 \times 10^{17}$ |
|   | n confinement | 0.45 | 2.00 | n | $10^{18}$ |
| 1 | $n^{++}$ substrate | 0.00 | | $n^{++}$ | |

Figure 2:
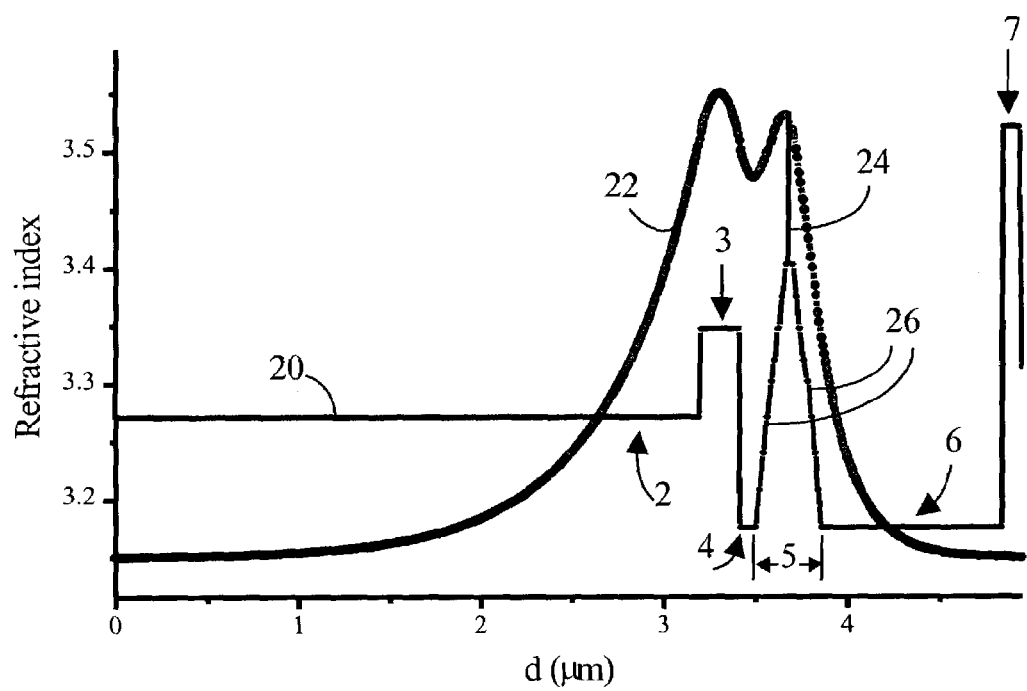
FIG. 2 is a graph of the refractive index and optical field in the laser as a function of growth thickness (i.e., from the substrate)

The depth profiles of refractive index 20 and optical field distribution 22 in the diode laser are shown as a function of total growth thickness d in FIG. 2. The reference numerals labelling various portions of the refractive index profile 20 are those of the corresponding layers of FIG. 1. The asymmetrical layer structure around the active layer 5 produces an asymmetric refractive index profile 20. In general, regions of relatively high refractive index attract the optical field distribution, whilst regions of relatively low refractive index repel or guide the optical field distribution away into the higher refractive index layers. The narrow layer with a high refractive index of approximately 3.5 and located near 5 μm in FIG. 2 is the approximately 0.2 μm GaAs contact layer 7. The next layer, from about 3.8-4.8 μm, is the approximately 1 μm thick p-type $Al_{0.6}Ga_{0.4}As$ confinement layer 6, with a constant refractive index near 3.17. Below this layer, the refractive index profile of the approximately 0.19 μm undoped active layer 5 includes narrow spikes 24 of high refractive index corresponding to the two active approximately 6 nm $In_{0.20}Ga_{0.80}As$ quantum wells, separated by an approximately 6 nm $Al_{0.20}Ga_{0.80}As$ barrier layer and surrounded by graded index regions 26. The layers below the active layer 5 are n-type. The layer immediately below the active layer 5, near a thickness value of about 3.4 µm in FIG. 2, is the approximately 0.1 µm thick $Al_{0.6}Ga_{0.4}As$ waveguide layer 4. The relatively low refractive index value of this layer, near 3.18, effectively repels the optical field distribution into adjacent layers. Beneath the waveguide layer 4, at thickness values of approximately 3.2-3.4 µm, is the approximately 0.22 µm thick $Al_{0.3}Ga_{0.7}As$ optical trap layer 3, with a relatively high refractive index value of approximately 3.33. The high refractive index of this trap layer 3 attracts or traps the optical field. Beneath this is the approximately 2.7 µm $Al_{0.45}Ga_{0.55}As$ n-type confinement layer 2, with a constant refractive index near 3.27.

The corresponding optical field depth distribution 22 within the laser, as shown in FIG. 2, is quite broad, with a total extent of about 6 µm in the layer growth direction. The asymmetric refractive index profile 20 produces an asymmetric optical field distribution 22 that includes two peaks, one in the active layer 5 and the other in the trap layer 3. In particular, the optical field distribution 22 is mostly spread in the n-type layers 2,3,4 of the laser and less spread in the p-type layers 6,7. This broad, asymmetric optical field distribution has two beneficial aspects: first, the optical loss of the laser is reduced by skewing the field to the n-type layers 2,3,4 of the structure because free carrier absorption by electrons is about half that of holes. Second, the series resistance of the laser diode is largely determined by the p-type layers 6,7 because the mobility of holes is significantly lower than that of electrons. Consequently, an additional effect of skewing the optical field out of the p-type layers 6,7 and into the n-type layers 2 to 4 is to lower the series resistance of the laser. Thus, in contrast to prior art diode lasers, the optical field distribution is spread in the transverse direction without incurring unacceptable increases of the intrinsic optical loss and/or series resistance.

In addition, the asymmetric structure is suited to high power operation. This is important because high power laser diodes generally operate very close to the power threshold for catastrophic optical mirror damage (COD). The lifetime of a diode laser critically depends on how close it operates to the COD threshold, which is directly proportional to the optical spot size. The spreading of the optical field naturally increases the spot size, thus increasing the power threshold for COD. The challenge is to increase the spot size in such a way that the corresponding increase of the threshold current density is tolerable for high power operation. In conventional structures optimized for high power operation, the typical spot size is about 0.4-0.6 µm. For the asymmetric diode laser structure of Table 1, the spot size is given by d/Γ=0.8 µm, where d and Γ are the thickness and confinement factor, respectively, of the active region 5. Thus, the laser is suited to high power operation.

Filamentation is believed to be caused by a phenomenon known as carrier-induced antiguiding, whereby the injection of carriers into the active region of a laser lowers its refractive index. For a ridge laser structure, the reduction of refractive index along a lateral direction across the ridge 8 is greatest at the centre of the ridge 8. The resulting refractive index profile, peaked at the edges of the ridge 8 and depressed towards its centre, increasingly favors the first order mode over the fundamental as the laser's injection current is increased. The beam steering associated with kinks in the L-I curves of diode lasers has been attributed to phase locking of the fundamental and first order lateral modes.

Lateral waveguiding in 980 nm laser diodes is more critical than for 870 nm lasers, because the amount of antiguiding, which is inevitably introduced by increasing carrier injection above threshold, is larger. The antiguiding factor, which is a measure of the variation of the real part of the refractive index that accompanies variations in gain by carrier injection, is b=6 for 980 nm lasers, and b=2 for 870 nm lasers. The magnitude of the carrier induced anti-guiding Δn is given by:

$$\Delta n = -b \cdot \Gamma \cdot \frac{\Delta g}{2k_o}; \quad k_o = \frac{2\pi}{\lambda_o} \quad \Gamma \cdot g = \alpha + \frac{1}{L} \cdot \ln\left(\frac{1}{R}\right) \quad (1)$$

where Γ is the confinement factor of the active region, $\lambda_o$ is the free space wavelength, and Δg is the gain difference between the center of the ridge 8 and its edges. In Equation (1), g is the maximum gain at threshold at the ridge center, α is the absorption factor, L is the device length, and R is the mirror reflectivity. It may be seen from Equation (1) that lowering the confinement factor will reduce the amount of carrier-induced anti-guiding, and therefore increase the power threshold for filamentation, referred to as the kink power.

Figure 3:
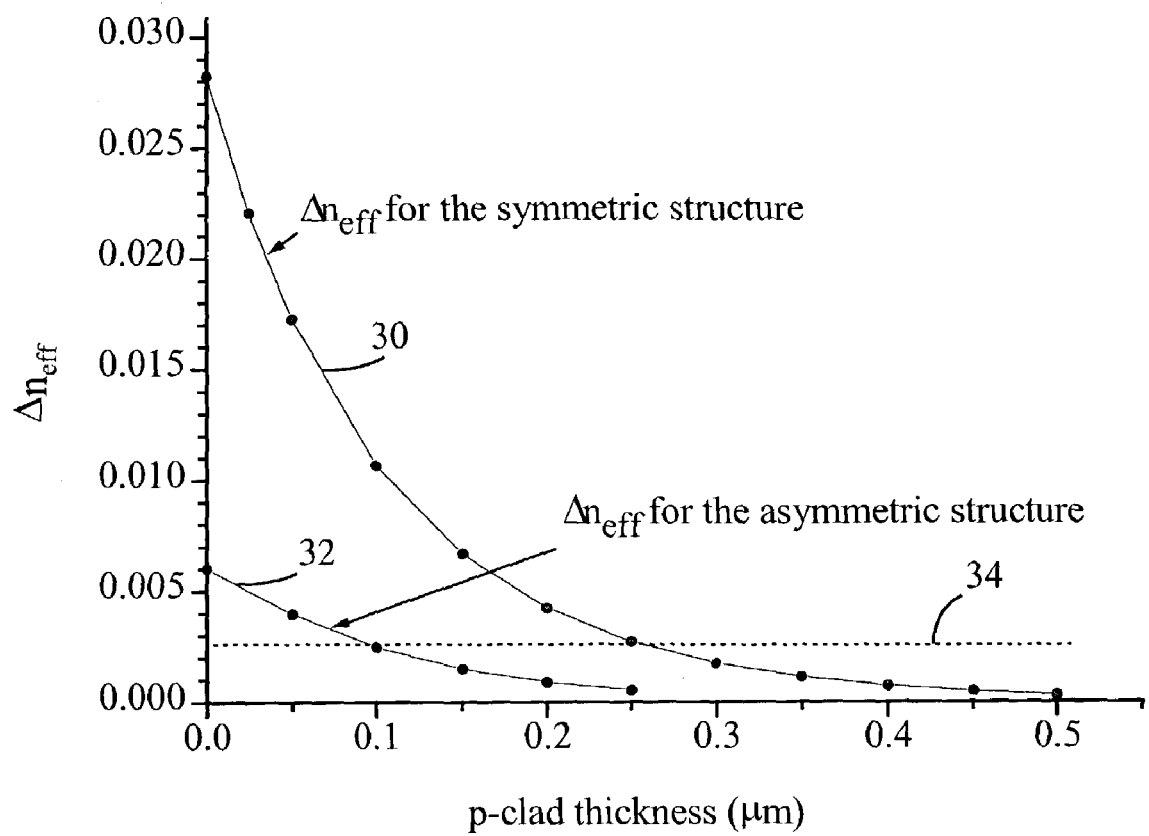
FIG. 3 is a graph of the amount of index guiding $\Delta n_{eff}$ in the laser due to etching the p-type cladding layer around the ridge as a function of the remaining thickness of the cladding layer, for conventional and asymmetric diode laser structures.

In ridge diode lasers, the fundamental lateral mode is favored by forming the ridge structure 8 to provide index guiding. FIG. 3 is a graph of the amount of index guiding $\Delta n_{eff}$ caused by etching the material surrounding the masked stripe used to define the ridge 8 as a function of the remaining thickness of the initially approximately 1 µm thick p-type $Al_{0.6}Ga_{0.4}As$ cladding layer 6. The lower curve 32 is for the asymmetric structure, and the upper curve 30 is for a typical prior art symmetric structure. For comparison, the maximum amount of step index guiding that would prevent the first order lateral mode is about $2.1 \times 10^{-3}$ for an approximately 4 µm wide ridge 8, and about $3.8 \times 10^{-3}$ for an approximately 3 µm wide ridge 8. A typical value for index guiding in prior art single emitter symmetric structures is about $5 \times 10^{-3}$.

If the amount of index guiding is too large, high order modes can reappear due to the large step in the lateral refractive index profile near the edges of the ridge 8. Thus, for a given structure, there is an optimal amount of index guiding that optimally favors the fundamental lateral mode over high order lateral modes. The upper curve 30 of FIG. 3 indicates that, for a remaining cladding thickness of about 0.175 µm (corresponding to $\Delta n_{eff} \approx 5 \times 10^{-3}$), unavoidable thickness variations of about 50 nm due to surface roughness or non-uniform etching of the approximately 1.5 µm etch can nearly double the index guiding value for a symmetric structure due to the almost exponential dependence of index guiding on etch depth in this range of values. In comparison, the reduced anti-guiding required by the asymmetric laser structure reduces the optimal amount of index-guiding to about $2.5 \times 10^{-3}$, represented by the dashed line 34 in FIG. 3. The lower curve 32 in FIG. 3 indicates that this corresponds to a thickness of about 0.1 µm for the remaining part of the p-type cladding layer 6. This corresponds to a total etch depth of about 1.1 µm, which is shallow enough to allow a conventional wet etch to be used to form an approximately 2-4 µm wide ridge 8 without compromising the series resistance of the laser. The reduced variation in index guiding resulting from this shallower etch maintains the second order lateral mode closer to cutoff than in a symmetric structure.

The kink power of a ridge diode laser critically depends on the amount of index guiding. The index guiding is designed to be larger than the carrier-induced antiguiding, estimated to be on the order of about $10^{-3}$ for approximately 1.5 mm long devices, to avoid beam steering at very low power levels. Conversely, it is also desirable that the amount of index-guiding is small to prevent the existence of the first order lateral mode in the waveguide, or at least to allow it only close to cut-off. If the amount of index guiding is too large, the unwanted first order mode will have enough gain to lase at currents only slightly above threshold, providing a significant contribution to the far-field optical output of the laser and significantly affecting the coupling of the laser with optical fibers.

Figure 4:
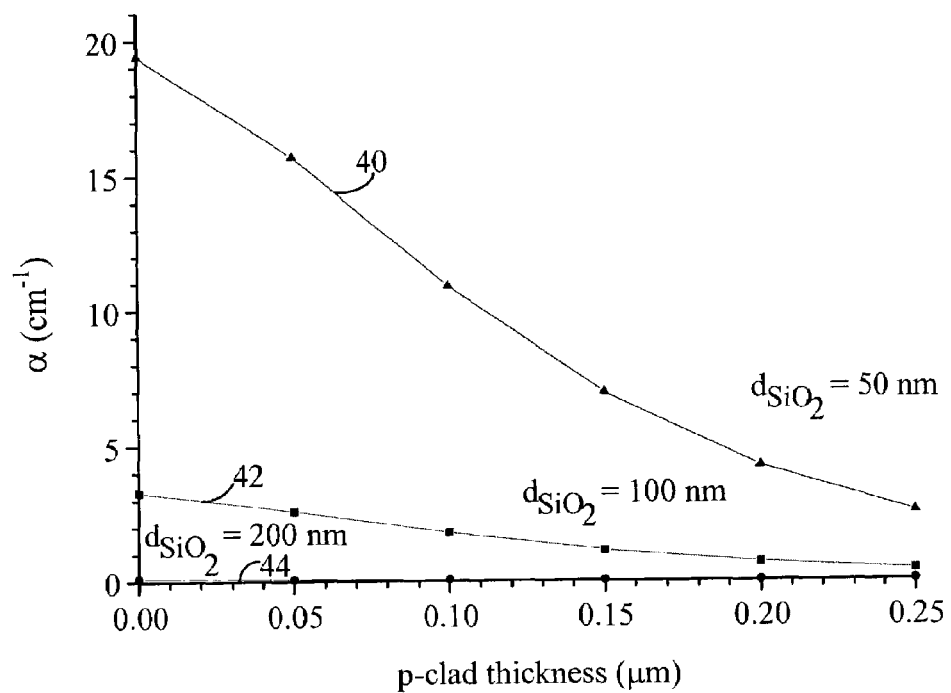
FIG. 4 is a graph of the absorption factor outside the ridge due to additional losses in the region around the ridge, caused by the extension of the optical field in Ti/Pt/Au metal contact layers, as a function of the remaining thickness of the cladding layer outside the ridge, for oxide thicknesses between the cladding and metal contact layers of about 50 and 100 nm.

FIG. 4 is a graph of the optical loss due to the optical field spread in the Ti/Pt/Au contact layer 10 around the ridge region 8, as a function of the thickness of the remaining p-type cladding layer 6. The upper 40, middle 42, and lower 44 curves are for oxide layer 9 thicknesses of about 50, 100, and 200 nm, respectively. An approximately 200 nm thick oxide layer 9 effectively decouples the optical field from the absorbing metal layers 10, whereas an approximately 50 nm-100 nm thick layer allows significant absorption outside the ridge 8. For comparison, the intrinsic loss in the waveguide is about 2.5 per centimeter ($cm^{-1}$), and the mirror losses are about 7.4 $cm^{-1}$ for an approximately 1.5 mm long device. Because the losses in the metal layers 10 are confined to the regions around the ridge 8, they can be exploited to control the discrimination between different transverse or lateral modes in the laser due to the different field strength distributions in the transverse (lateral) dimension.

Figure 5:
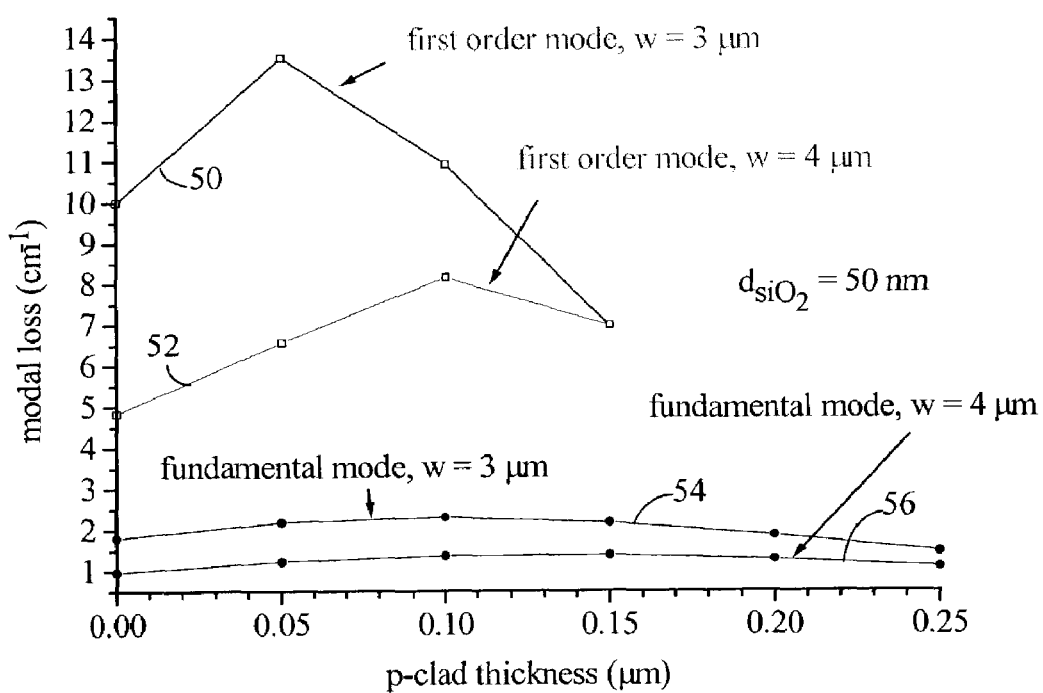
FIGS. 5 and 6 are graphs of the absorption coefficient due to lateral modal loss as a function of the cladding layer thickness, for the fundamental and first order lateral modes in lasers with ridge widths of about 3 and 4 μm, and oxide layer thickness of about 50 nm and 100 nm, respectively.
Figure 6:
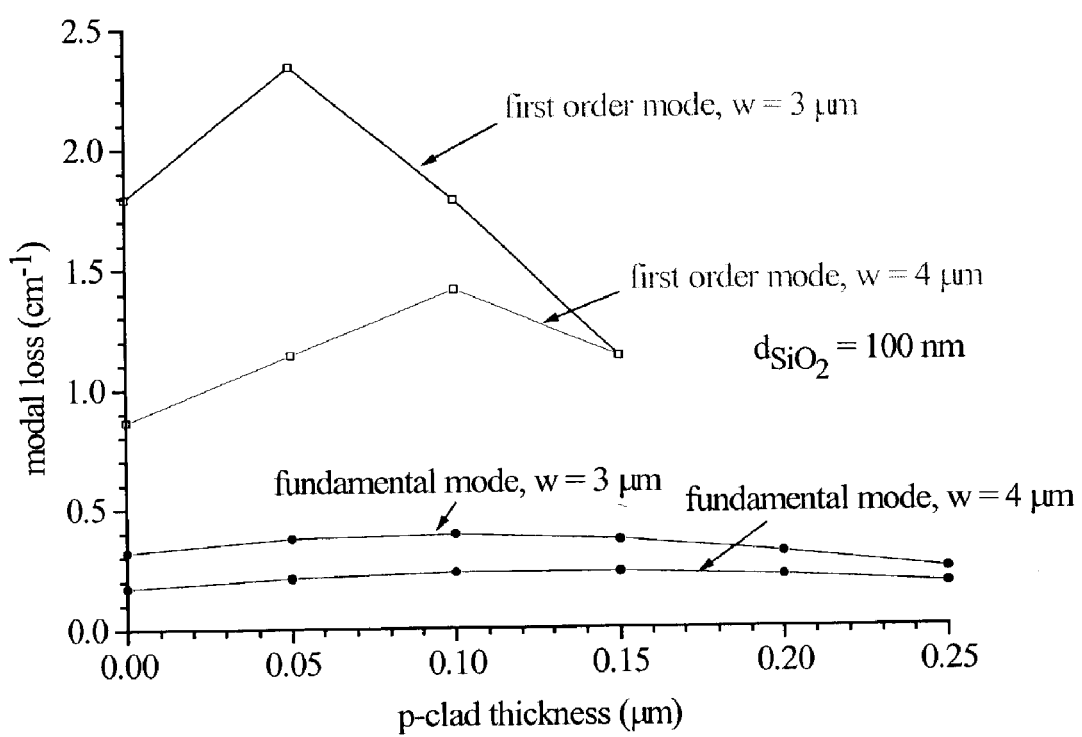

FIG. 5 is a graph of the absorption coefficient due to lateral modal loss as a function of the remaining thickness of the p-type cladding layer 6 for the fundamental and first-order lateral modes in lasers with ridge widths of about 3 and 4 μm, and an oxide layer thickness of about 50 nm. The first order mode losses for approximately 3 μm 50 and 4 μm 52 devices show strong absorption on the order of about 10 $cm^{-1}$, whereas the corresponding fundamental mode losses 54, 56 are significantly lower, at about 1-2 $cm^{-1}$. FIG. 6 shows the results of the same measurements for lasers with an oxide layer that is twice as thick, at about 100 nm. The same trend occurs, but, as expected, with much lower absorption values of approximately 1-2 $cm^{-1}$ for the first order mode, and about 0.2-0.3 $cm^{-1}$ for the fundamental mode. In all cases, the modal losses associated with the first order mode, which extends well beyond the ridge region 8 in the transverse direction, are significant, whereas the fundamental mode modal losses are low enough to not significantly affect the differential efficiency of the lasers. Consequently, the use of a thin oxide layer 9 suppresses the first order mode, whilst not significantly affecting the fundamental. By controlling the thickness of the oxide layer 9, and therefore the optical loss in the region around the ridge 8, the discrimination between optical modes of the laser is also controlled.

Figure 7:
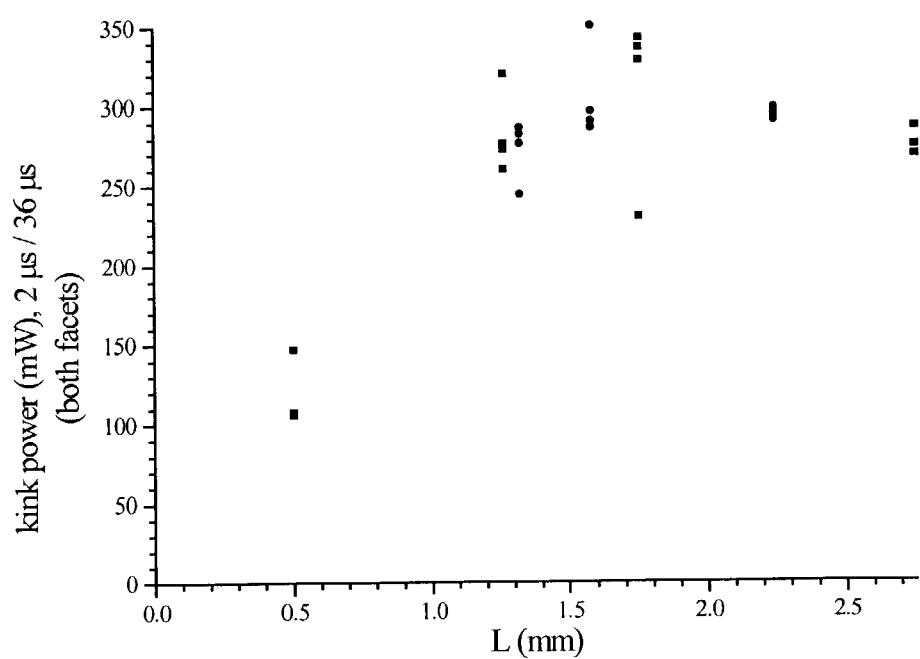
FIG. 7 is a graph of the kink power as a function of laser length for lasers with the optimum etch depth of about 1.10 μm and an oxide thickness of about 200 nm.
Figure 8:
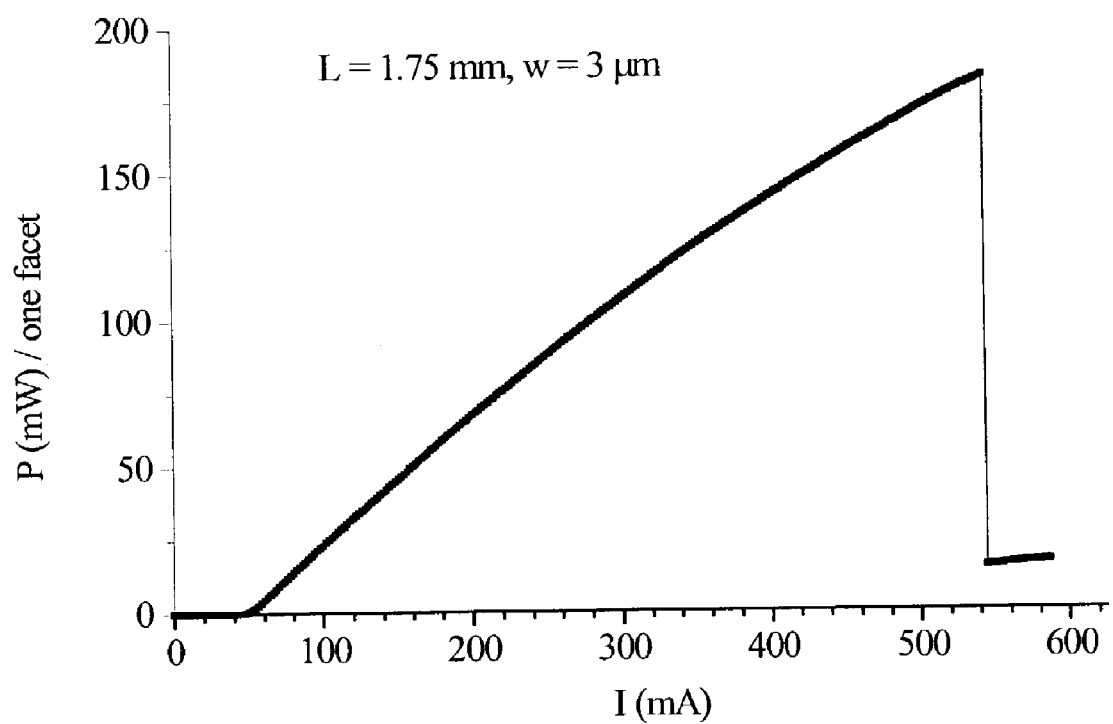
FIG. 8 is a graph of output light power as a function of injection current for continuous wave operation (i.e., the CW L-I curve) of a laser with a ridge width of about 3 μm.

The suppression of the first order lateral mode relative to the fundamental lateral mode increases the kink power of the lasers. FIG. 7 is a graph of kink power as a function of laser length for lasers with the optimal etch depth of about 1.10 μm (i.e., approximately 0.1 μm of the cladding layer 6 remaining) and an oxide thickness of about 200 nm. The kink power measurements were made under pulsed conditions, with a pulse width of about 2 μs and an approximately 36 μs delay period between pulses, corresponding to a duty cycle of about 5.5%. The wavelength shift observed in laser beams generated by Fabry-Perot edge emitting devices can be related to cavity expansion due to heating caused by current injection. In general, the wavelength shift from about 50 mA (threshold) to about 500 mA for unmounted devices is about 13 nm, which translates into a temperature rise of approximately 38° C., assuming a wavelength shift of about 0.34 nm/° C. Almost the same amount of heating was measured under CW conditions in an approximately 1.7 mm long device whose p-type contact was mounted on a Cu cooling block with In (hereinafter referred to as "p-down mounting"), corresponding to a device thermal resistance of about 48 K/W. Therefore, the thermal load for unmounted devices measured with an approximately 5.5% duty cycle is similar to the thermal load corresponding to CW operation for p-down mounted laser diodes. Consequently, it appears that the kink-free power for unmounted devices under these conditions is very close to the kink-free power for well-mounted devices under CW conditions. For example, FIG. 8 is a graph of the light output power per facet as a function of injection current (i.e., the "L-I curve") for a well (p-down) mounted laser operating under CW conditions. Accordingly, FIG. 7 demonstrates that most of the lasers with lengths of about 1.5 mm have kink powers in excess of about 250 mW, and in the range of about 250-350 mW.

Figure 9:
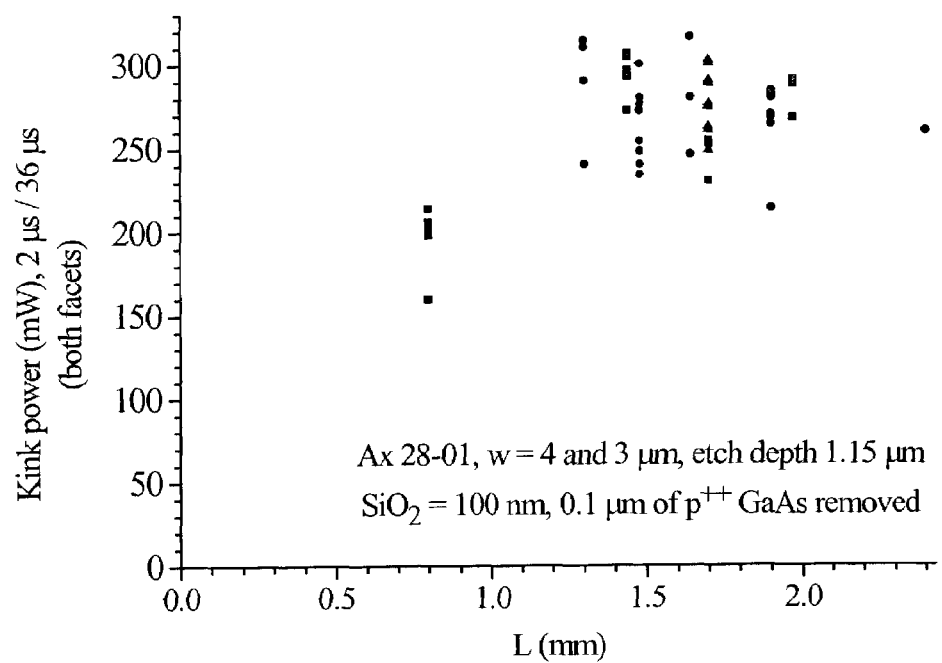
FIGS. 9 and 10 are graphs of the kink power as a function of laser length for lasers with an etch depth of about 1.15 μm (approximately 50 nm more than the optimum etch depth) and oxide thicknesses of about 100 nm and 200 nm, respectively.
Figure 10:
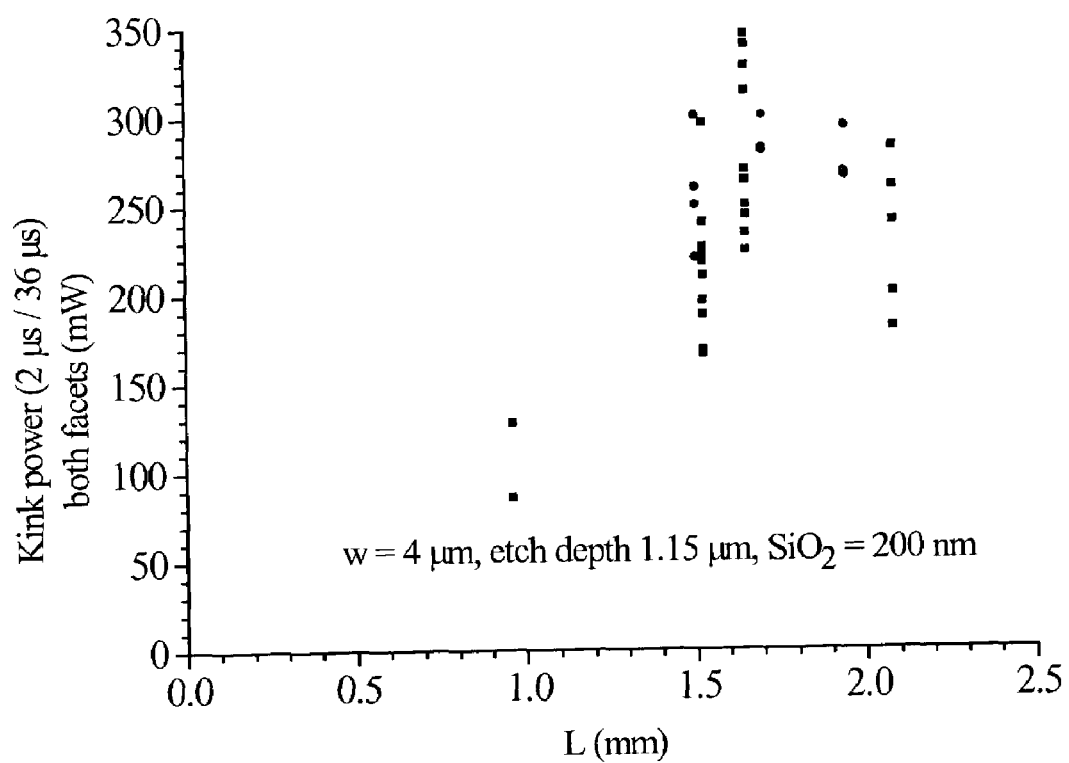
Figure 11:
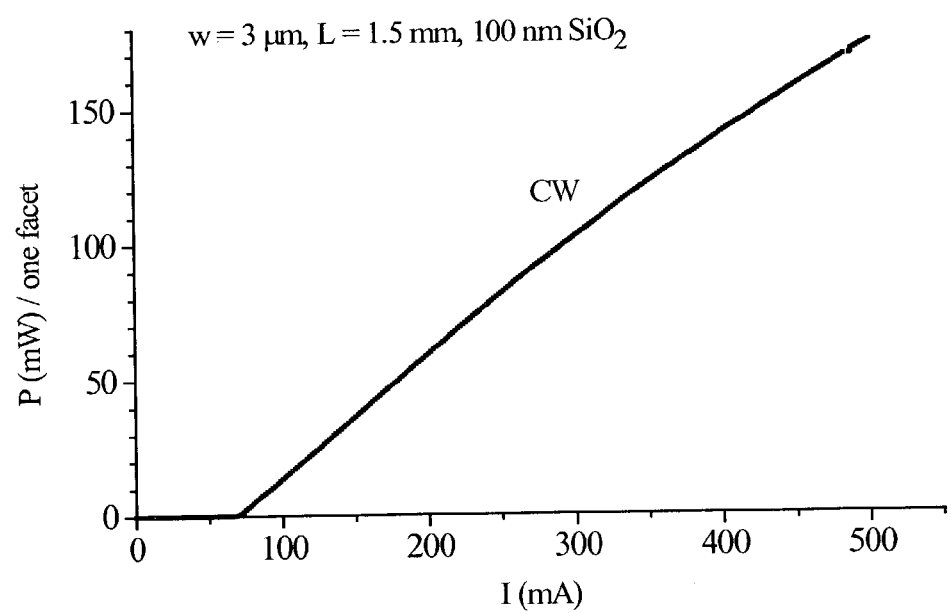
FIG. 11 is a graph of output power as a function of injection current for continuous wave operation of a laser with a ridge width of about 3 μm and an oxide thickness of about 100 nm.

FIGS. 9 and 10 are more graphs of kink power as a function of laser length, but for lasers with an etch depth of about 1.15 μm, i.e., approximately 50 nm more than the optimum value, for oxide thicknesses of about 100 nm and 200 nm, respectively. Devices with the thinner (approximately 100 nm) oxide layer 9 are more stable, with the majority of devices having a kink level above about 250 mW. In contrast, the kink powers of devices with the thicker (approximately 200 nm) oxide layer 9 are scattered over a much larger range of kink powers, presumably due to beatings between the first order mode and the fundamental mode triggered by small longitudinal non-uniformities. Such non-uniformities can be, for example, small variations in the thickness of the p-cladding layer 6 remaining outside the ridge region 8 due to small variations in etch depth and/or surface roughness.

These characteristics have been determined by the particular asymmetric layer structure shown in Table 1. However, it will be apparent to one skilled in the art that many possible layer structures can be used to provide similar benefits. Due to the complex nature of diode laser physics, it is not generally possible to define strict rules for determining which layer structures will provide the desired characteristics for a given application. Ultimately, the characteristics of a particular layer structure may be simulated using standard transfer matrix calculations, such as described in K. H. Schlereth and M. Tacke, *The Complex Propagation of Multilayer Waveguides: an Algorithm for a Personal Computer*, IEEE Journal of Quantum Electronics, Vol. 26, p. 627 (1990) ("Schlereth").

Notwithstanding the above, it is possible to state a number of design guidelines that can be used to reduce the time required to design a laser structure with good performance characteristics, such as the structure of the preferred embodiment. For example, the following procedure can be used to determine a suitable asymmetric structure:

(i) Design an asymmetric layer structure for the diode laser. In addition to an active layer for generating the optical field, the structure preferably includes a trap layer for attracting the optical field, and a separation layer of very low refractive index between the active layer and the trap layer for repelling the optical field. Additional trap layers can, of course, be included, but a simple structure is generally preferred, to reduce the number of (absorptive) layer interfaces, for example.

(ii) Include at least one trap layer of high refractive index to skew the optical distribution away from p-type layers and towards n-type layers of the structure. However, the refractive index of the trap layer should not be so high relative to the refractive index of the active layer as to result in a high degree of recombination in the trap layer. This would decrease recombination in the active layer, reducing gain and increasing the threshold current of the laser.

(iii) Ensure that the asymmetric structure is not so asymmetric that it does not support the fundamental mode at the operating wavelength of the laser. This can be achieved by selecting layer parameters to support the fundamental mode, based on numeric modelling of the structure, such as described in Schlereth. Moreover, the fundamental mode should be sufficiently removed from cutoff that technological variations during fabrication are not likely to result in the fundamental mode being cutoff in practice.

(iv) Design the asymmetric layer structure to have low confinement. That is, the optical field distribution should not be too narrow in the growth direction. It will be apparent to one skilled in the art that it is not practical to define this quantitatively due to the complex distributions that can be obtained from multi-layer structures. The spot size d/Γ is preferably at least about 0.8 µm.

(v) Include a confinement layer of low refractive index between the metal contact layer and the other layers of the structure to separate the optical field from the contact layer and metal contact, and thus reduce overall optical absorption in these layers.

(vi) The configuration of the trap layer and the substrate should be such as to keep the optical field sufficiently removed from the substrate to avoid excessive absorption in the latter. A thick confinement layer of low refractive index can be used for this purpose.

(vii) The total internal loss is determined by (v) and (vi) above, as well as the number of layer interfaces. Additionally, free carrier absorption at high injection levels contributes to the internal loss.

(viii) Bearing in mind the above guidelines, the beam divergence in the transverse (i.e., growth) direction is preferably about 28° or less. As described above, this preferably involves transfer matrix simulation of the structure. If the divergence is too high, then the layer structure is adjusted (e.g., by reducing the confinement of the optical field by broadening a layer of high refractive index, or adding another layer of high refractive index) and the simulation repeated. This iterative procedure can be continued until the divergence is as low as desired.

Although the preferred embodiment is described above in terms of a ridge diode laser with an asymmetric layer structure, it will be apparent that alternative embodiments of the invention can include other laser structures, including symmetric ridge lasers, tapered lasers, and other types of optical devices with lateral confinement, such as optical amplifiers.

Many modifications will be apparent to those skilled in the art without departing from the scope of the present invention as herein described with reference to the accompanying drawings.

What is claimed is:

1. A single-mode optical device, including:
   a first region comprising an active region disposed between p-type and n-type cladding layers formed on a substrate, said first region including an elongated ridge at least a portion of which forms an electrical contact, and
   a second region laterally disposed about said ridge in said first region, said second region including an absorbing layer and an isolation layer disposed between said absorbing layer and said active region in said first region, said absorbing layer disposed on said isolation layer without any intervening layer therebetween,
   wherein said active layer generates an optical field, the thickness of said isolation layer being less than about 200 nm such that said optical field extends from said first region to said absorbing layer in said second region, causing absorption of said optical field by said absorbing layer in said second region and thereby suppresses one or more higher order lateral optical modes of said device relative to a fundamental lateral optical mode of said device.

2. A single-mode optical device as claimed in claim 1, wherein said one or more higher order lateral optical modes are attenuated relative to the fundamental lateral mode of said device to provide said device with a high kink power.

3. A single-mode optical device as claimed in claim 2, wherein said kink power is at least about 200 mW.

4. A single-mode optical device as claimed in claim 2, wherein said kink power is at least about 250 mW.

5. A single-mode optical device as claimed in claim 1, wherein said absorbing layer includes an electrically conducting layer, and said isolation layer includes an electrically insulating layer.

6. A single-mode optical device as claimed in claim 5, wherein said electrically conducting layer provides electrical contact to said device.

7. A single-mode optical device as claimed in claim 5, wherein said electrically conducting layer comprises a gold layer.

8. A single-mode optical device as claimed in claim 5, wherein said electrically insulating layer includes one of a silicon oxide and a silicon nitride layer.

9. A single-mode optical device as claimed in claim 1, wherein said thickness is at most about 100 nm.

10. A single-mode optical device as claimed in claim 9, wherein said thickness is at least about 50 nm to reduce absorption of said fundamental lateral optical mode of said device.

11. A single-mode optical device as claimed in claim 1, wherein said device is a ridge diode laser.

12. A single-mode optical device as claimed in claim 11, wherein the width of the ridge is between about 2 and 4 µm.

13. A single-mode optical device as claimed in claim 12, wherein the length of the ridge is more than about 1.5 mm.

14. A single-mode optical device as claimed in claim 12, wherein the length of the ridge is between about 1.5 to 2 mm.

15. A single-mode optical device as claimed in claim 11, wherein the width and height of the ridge is such that absorption of said optical field is caused by said absorbing layer and at least the first order lateral mode is thereby suppressed relative to the fundamental lateral optical mode of said device.

16. A single-mode optical device as claimed in claim 1, wherein said device includes a plurality of layers having a substantially asymmetric refractive index profile with respect to a growth direction of said layers, said plurality of layers being configured to produce an optical field distribution with a larger fraction of said distribution in n-type layers than in p-type layers of said device.

17. A single-mode optical device as claimed in claim 16, wherein said layers include said active layer, a trap layer for attracting the optical field, and a layer between the active layer and the trap layer for guiding the optical field into the trap layer.

18. A single-mode optical device as claimed in claim 16, wherein said device is a diode laser and said plurality of layers is configured so that the spot size of the beam generated by said laser is at least about 0.8 µm.

19. A single-mode optical device as claimed in claim 1, wherein said device is an optical amplifier.

20. A single-mode optical device as claimed in claim 1, wherein the thickness of said isolation layer is such that at least the first order lateral mode is suppressed relative to the fundamental lateral optical mode of said device.

21. A single-mode optical device as claimed in claim 1, wherein at least one of said cladding layers is disposed between said active layer and said isolation layer, the thicknesses of said at least one cladding layer and said isolation layer being such that said optical field extends from said first region to said absorbing layer in said second region, causing absorption of said optical field by said absorbing layer, thereby suppressing at least the first order lateral mode relative to the fundamental lateral optical mode of said device.

22. A single-mode optical device as claimed in claim 1, wherein said absorbing layer comprises metal.

23. A single-mode optical device as claimed in claim 22, wherein said isolation layer comprises dielectric.

24. A single-mode optical device as claimed in claim 1, wherein said thickness of said isolation layer is such that absorption of said first order lateral optical mode is about 10 times greater than absorption of said fundamental lateral optical mode of said device.

25. A single-mode optical device as claimed in claim 1, wherein said thickness of said isolation layer is sufficiently large to not significantly affect a differential efficiency of said device.

26. A single-mode optical device as claimed in claim 1, wherein said thickness of said isolation layer is such that absorption of said first order lateral optical mode of said device is about 10 $cm^{-2}$, and absorption of said fundamental lateral optical mode of said device is about 1-2$cm^{-2}$.

27. A single-mode optical device as claimed in claim 26, wherein said thickness of said isolation layer is about 50 nm.

28. A single-mode optical device as claimed in claim 1, wherein said thickness of said isolation layer is such that absorption of said first order lateral optical mode of said device is about 1-2$cm^{-2}$, and absorption of said fundamental lateral optical mode of said device is about 0.2-0.3 $cm^{-2}$.

29. A single-mode optical device as claimed in claim 28, wherein said thickness of said isolation layer is about 100 nm.

* * * * *